(12) United States Patent
Lee

(10) Patent No.: US 7,691,657 B2
(45) Date of Patent: Apr. 6, 2010

(54) LIGHT EMITTING DEVICE USING NITRIDE SEMICONDUCTOR AND FABRICATION METHOD OF THE SAME

(75) Inventor: Suk Hun Lee, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/288,310

(22) Filed: Nov. 29, 2005

(65) Prior Publication Data

US 2006/0081831 A1   Apr. 20, 2006

Related U.S. Application Data

(62) Division of application No. 10/517,819, filed as application No. PCT/KR2004/001480 on Jun. 21, 2004, now Pat. No. 7,193,236.

(30) Foreign Application Priority Data

Jun. 25, 2003   (KR) .............................. 2003-41409

(51) Int. Cl.
    *H01L 21/00* (2006.01)
(52) U.S. Cl. ........................... 438/46; 438/47; 438/172; 257/E21.124
(58) Field of Classification Search ............. 257/10–39, 257/79–103, E21.124; 438/46, 47, 172

See application file for complete search history.

(56) References Cited

U.S. PATENT DOCUMENTS 6,266,355 B1 * 7/2001 Sverdlov ................. 372/45.01
6,274,399 B1   8/2001 Kern et al.

(Continued)

FOREIGN PATENT DOCUMENTS

EP   0762516   3/1997

(Continued)

OTHER PUBLICATIONS

S. Keller, "Growth and Properties of InGaN nanoscale islands on GaN" Journal of Crystal Growth, vols. 189-190, Jun. 15, 1998, pp. 29-32.*

(Continued)

*Primary Examiner*—Phat X. Cao
(74) *Attorney, Agent, or Firm*—Birch, Stewart, Kolasch & Birch, LLP

(57) ABSTRACT

A nitride based 3-5 group compound semiconductor light emitting device comprising: a substrate; a buffer layer formed above the substrate; a first In-doped GaN layer formed above the buffer layer; an $In_xGa_{1-x}N/In_yGa_{1-y}N$ super lattice structure layer formed above the first In-doped GaN layer; a first electrode contact layer formed above the $In_xGa_{1-31\ x}N/In_yGa_{1-y}N$ super lattice structure layer; an active layer formed above the first electrode contact layer and functioning to emit light; a second In-doped GaN layer; a GaN layer formed above the second In-doped GaN layer; and a second electrode contact layer formed above the GaN layer. The present invention can reduce crystal defects of the nitride based 3-5 group compound semiconductor light emitting device and improve the crystallinity of a GaN GaN based single crystal layer in order to improve the performance of the light emitting device and ensure the reliability thereof.

16 Claims, 4 Drawing Sheets

U.S. PATENT DOCUMENTS

| | | | | |
|---|---|---|---|---|
| 6,479,836 | B1 * | 11/2002 | Suzuki et al. | 257/15 |
| 6,720,570 | B2 * | 4/2004 | Lee et al. | 257/14 |
| 6,830,948 | B2 * | 12/2004 | Koike et al. | 438/46 |
| 6,838,705 | B1 | 1/2005 | Tanizawa | |
| 2004/0125839 | A1 * | 7/2004 | Lee et al. | 372/45 |

FOREIGN PATENT DOCUMENTS

| | | |
|---|---|---|
| EP | 1063711 | 12/2000 |
| JP | 08-255932 A | 10/1996 |
| JP | 09-232629 | 9/1997 |
| JP | 09-304272 | 11/1997 |
| JP | 10-4210 A | 1/1998 |
| JP | 10-189944 | 7/1998 |
| JP | 10-214999 A | 8/1998 |
| JP | 10-303458 A | 11/1998 |
| JP | 11145063 | 5/1999 |
| JP | 11-340509 A | 12/1999 |
| JP | 2000-332288 A | 11/2000 |
| JP | 2001-148507 A | 5/2001 |
| JP | 2001-156003 A | 6/2001 |
| JP | 2002-111133 | 4/2002 |
| JP | 2003-060236 A | 2/2003 |
| JP | 2003-110197 | 4/2003 |
| JP | 2003-152219 A | 5/2003 |
| KR | 2003-33842 10 * | 5/2003 ................ 372/45 |
| WO | WO-03/073484 A1 | 9/2003 |

OTHER PUBLICATIONS

Liu C H et al.: "Tunneling Efficiency of N+-Ingan/Gan Short Period Superlattice Tunneling Contact Layer for Nitride-Based Light Emitting Diodes" Semiconductor Science and Technology, 10P, Bristol, Gb, vol. 185 No. 6, Apr. 28, 2003, pp. 545-548, XP001170773.

Uchida Kenji et al.: "Spiral Growth of InGaN/InGaN Quantum Wells Due to Si Doping in the Barrier Layers" Applied Physics Letters, AIP American Institute of Physics, Melville, NY, US, vol. 74, No. 8, Feb. 22, 1999, pp. 1153-1155, XP012023313.

Kneissl Michael et al: "Room-Temperature Continuous-Wave Operation of InGaN MultipleQuantum-well laser Diodes.With an Asymmetric waveguide Structure" Applied Physics Letters, AIP, American Institute of Physics, Melville, NY, US, vol. 75,. No. 4, Jul. 26, 1999, pp. 581583, XP012024469.

\* cited by examiner

LIGHT EMITTING DEVICE USING NITRIDE SEMICONDUCTOR AND FABRICATION METHOD OF THE SAME

This application is a Divisional of application Ser. No. 10/517,819, filed on Dec. 14, 2004 now U.S. Pat. No. 7,193,236, and for which priority is claimed under 35 U.S.C. § 120. Application Ser. No. 10/517,819 is the national phase of PCT International Application No. PCT/KR2004/001480 filed on Jun. 21, 2004 under 35 U.S.C. § 371, which claims priority on Korean Application No. 41409/2003 filed in Korea on Jun. 25, 2003. The entire contents of each of the above-identified applications are hereby incorporated by reference.

TECHNICAL FIELD

The present invention relates to a nitride based 3-5 group compound semiconductor. More particularly, the present invention relates to a nitride based 3-5 group compound semiconductor light emitting device and a fabrication method thereof capable of reducing crystal defects originated from the mismatch of thermal expansion coefficient and lattice constant between a substrate and a GaN based single crystal layer grown thereon as well as improving the crystallinity of the GaN based single crystal layer in order to improve the performance of the light emitting device and ensure the reliability thereof.

BACKGROUND ART

GaN-based semiconductors are generally applied to optical devices such as a blue/green LED and high-speed switching and high-power electronic devices such as a Metal Semiconductor Field Effect Transistor (MESFET) and a High Electron Mobility Transistor (HEMT). In particular, blue/green LEDs have been mass produced lately, and their worldwide demand is rising sharply.

A GaN-based semiconductor light emitting device is typically grown on a substrate of sapphire or SiC. Then, a polycrystalline layer of $Al_yGa_{1-y}N$ is grown as a buffer layer on the sapphire or SiC substrate at a low growth temperature. At a higher temperature, an undoped GaN layer and a Si-doped n-type GaN layer or a mixed structure thereof are grown on the buffer layer to provide the n-type GaN layer as a first electrode contact layer. Then, a Mg-doped p-type layer is formed as a second electrode contact layer thereon to produce a nitride based 3-5 group compound semiconductor light emitting device. In addition, an active layer (of a multiple quantum well structure) is interposed between the n-type first electrode contact layer and the p-type second electrode contact layer.

In the nitride based 3-5 group compound semiconductor light emitting device of this structure, crystal defects found in the interface between the substrate and the buffer layer have a very high value of about $10^8/cm^3$. As a result, this degrades electrical characteristics of the nitride based 3-5 group compound semiconductor light emitting device, and more particularly, increases leakage current under reverse bias conditions, thereby causing a fatal effect to the reliability of the light emitting device.

In addition, the crystal defects created in the interface between the substrate and the buffer layer degrades the crystallinity of the active layer, and therefore disadvantageously lowers the luminous efficiency of the nitride based 3-5 group compound semiconductor light emitting device.

In the meantime, in order to improve the performance and reliability of the GaN-based semiconductor light emitting device, researches have been made for new buffer layers and various fabrication methods of GaN-based semiconductors have been studied.

DISCLOSURE OF THE INVENTION

The present invention has been made to solve the foregoing problems of the prior art and it is therefore an object of the present invention to provide a nitride based 3-5 group compound semiconductor light emitting device and a fabrication method thereof capable of reducing crystal defects of a GaN based single crystal layer as well as improving its crystallinity in order to improve the performance and reliability thereof.

It is another object of the present invention to provide a nitride based 3-5 group compound semiconductor light emitting device and a fabrication method thereof capable of practically realizing high brightness performance from an active layer of only a single quantum well structure.

According to an aspect of the invention for realizing the above objects, there is provided A nitride based 3-5 group compound semiconductor Light emitting device comprising: a substrate; a buffer layer formed above the substrate; a first In-doped GaN layer formed above the buffer layer; an $In_xGa_{1-x}N/In_yGa_{1-y}N$ super lattice structure layer formed above the first In-doped GaN layer; a first electrode contact layer formed above the $In_xGa_{1-x}N/In_yGa_{1-y}N$ super lattice structure layer; an active layer formed above the first electrode contact layer and functioning to emit light; a second In-doped GaN layer; a GaN layer formed above the second In-doped GaN layer; and a second electrode contact layer formed above the GaN layer.

According to another aspect of the invention for realizing the above objects, there is provided A nitride based 3-5 group compound semiconductor light emitting device comprising: a substrate; a buffer layer formed above the substrate; a first In-doped GaN layer formed above the buffer layer; a first electrode contact layer formed above the first In-doped GaN layer; an active layer formed above the first electrode contact layer and functioning to emit light; a GaN layer formed above the active layer; and a second electrode contact layer formed above the GaN layer.

According to further an aspect of the invention for realizing the above objects, there is provided A nitride based 3-5 group compound semiconductor light emitting device comprising: a substrate; a buffer layer formed above the substrate; a first electrode contact layer formed above the GaN buffer layer; an active layer formed above the first electrode contact layer, and including a low mole In-doped $In_xGa_{1-x}N$ layer, an $In_yGa_{1-y}N$ well layer and an $In_zGa_{1-z}N$ barrier layer; a GaN layer formed above the active layer; and a second electrode contact layer formed above the GaN layer.

According to still another aspect of the invention for realizing the above objects, there is provided A fabrication method of a nitride based 3-5 group compound semiconductor light emitting device, comprising: forming a buffer layer above a substrate; forming a first In-doped GaN layer above the buffer layer; forming a first electrode contact layer above the first In-doped GaN layer; forming an active layer for emitting light above the first electrode contact layer; forming a GaN layer above the active layer; and forming a second electrode contact layer above the GaN layer.

The advantage of the present invention is to reduce crystal defects of a GaN based single crystal layer as well as improve its crystallinity, thereby improving the performance and reliability thereof.

As another advantage, the present invention can practically realize high brightness performance from an active layer of only a single quantum well structure.

BEST MODE FOR CARRYING OUT THE INVENTION

Hereinafter, preferred embodiments of the present invention will be described in detail with reference to accompanying drawings.

While preferred embodiments of the present invention will be described in reference with the accompanying drawings, it is apparent to those skilled in the art that the principle of the present invention is not limited by the disclosed embodiments thereof, but can be readily modified into various alternatives through the addition, variation and omission of components.

FIRST EMBODIMENT

Figure 1:
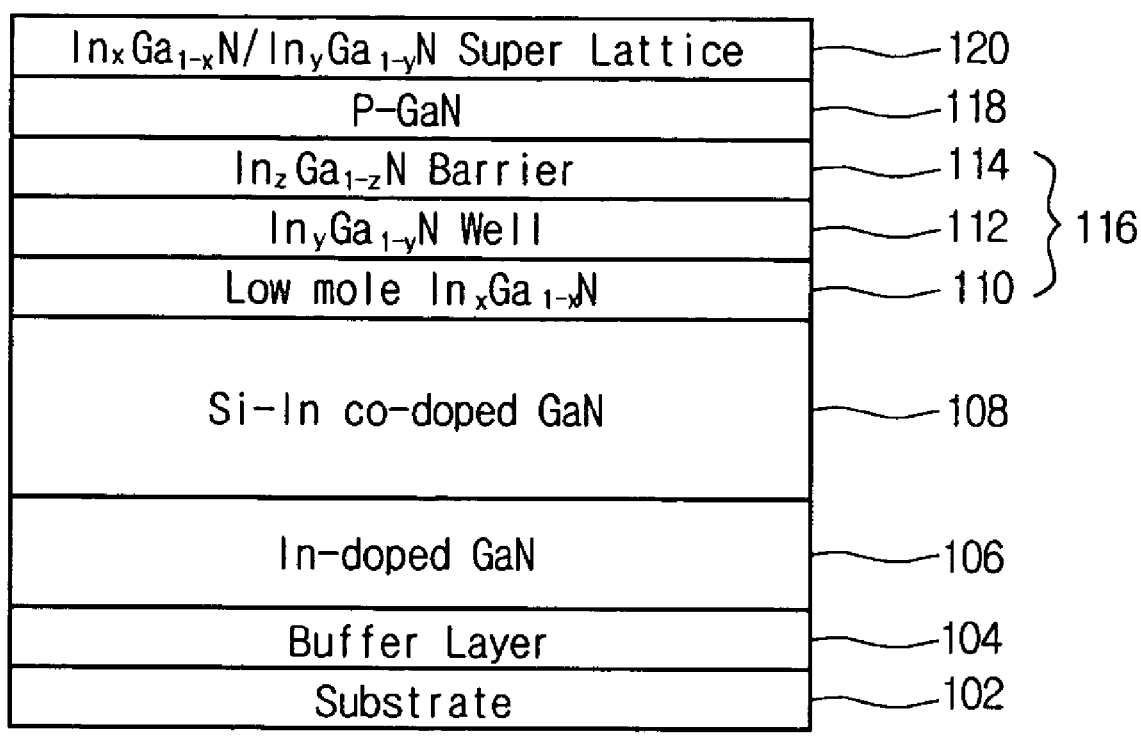
FIG. 1 illustrates a structure of a nitride based 3-5 group compound semiconductor light emitting device according to a first embodiment of the present invention.

FIG. 1 illustrates a structure of a nitride based 3-5 group compound semiconductor light emitting device according to a first embodiment of the present invention.

As shown in FIG. 1, a nitride based 3-5 group compound semiconductor light emitting device has a cross-sectional structure including a buffer layer 104 grown on a substrate 102, a first electrode contact layer 108 made of an n-type GaN layer (codoped with Si and In) and a second electrode contact layer 120 of an $In_xGa_{1-x}N/In_yGa_{1-y}N$ super lattice structure. Herein, the first and second electrode contact layers 108 and 120 are provided with electrodes (not shown), respectively, in following process steps so that external voltage can be applied thereto via the electrodes.

The nitride based 3-5 group compound semiconductor light emitting device of the present invention also has an active layer 116 of a quantum well structure which is interposed between the first electrode contact layer 108 and the second electrode contact layer 120 to form a hetero-structure. The active layer 116 includes a low mole In-doped GaN layer 110, an $In_yGa_{1-y}N$ well layer 112 and an $In_xGa_{1-x}N$ barrier layer 114.

In addition, the nitride based 3-5 group compound semiconductor light emitting device also has an In-doped GaN layer 106 formed between the buffer layer 104 and the first electrode contact layer 108 and a p-type GaN layer 118 formed between the $In_xGa_{1-x}N$ barrier layer 114 and the second electrode contact layer 120.

A fabrication method of the nitride-based 3-5 group compound semiconductor light emitting device of the present invention will be described as follows:

First, a GaN buffer layer 104 is formed on a sapphire substrate 102 at a low growth temperature. Then, the buffer layer 104 of the GaN-based semiconductor may be grown into an InGaN/GaN super lattice structure and a structure of $In_xGa_{1-x}N/GaN$ and $Al_xIn_yGa_{1-x-y}N/In_xGa_{1-x}N/GaN$ at the low growth temperature.

The buffer layer 104 formed on the substrate 102 as above can efficiently restrain crystal defects induced from the mismatch of thermal expansion coefficient and lattice constant between the substrate 102 and a GaN-based single crystal layer grown on the substrate 102, thereby producing a high quality GaN-based semiconductor.

More particularly, in the process step of growing the GaN buffer layer 104, $H_2$ and $N_2$ carrier gases, TMGa, TMIn and TMAl sources and $NH_3$ gas are fed at a temperature of about 500 to 700° C. to grow the GaN buffer layer 104.

Then, an In-doped GaN layer 106 and a GaN layer 108 containing Si and In codoped therein are grown on the buffer layer 104 at a high growth temperature. Herein the Si/In-codoped GaN layer 108 is used as a first electrode contact layer.

More particularly, in the process step of growing a GaN based single crystal layer of the GaN-based semiconductor, the GaN based single crystal layer is grown by feeding TMGa, TMIn and TMAl sources at a temperature of about 900 to 1100° C. with an MOCVD apparatus, in which $SiH_4$ gas may be used as a Si doping source, and TMIn may be used as an In doping source.

The active layer 116 for emitting light in a desired wavelength range includes a single quantum well. More particularly, the low mole In-doped GaN layer 110 of the active layer 116 is grown in the range of 10 to 500 Å. More preferably, the low mole In-doped GaN layer 110 is grown to a thickness in the range of 50 to 300 Å. The content of the low mole In-doped GaN layer may be expressed as $In_xGa_{1-x}N$ ($0<x\leq0.2$). Then, a quantum well layer of an $In_yGa_{1-y}N$ well layer 112 and an $In_zGa_{1-z}N$ barrier layer 114 of different In content is grown on the low mole In-doped $In_xGa_{1-x}N$ layer 110 to form the active layer.

In the process step of growing a single quantum well structure of the active layer 116, the low mole In-doped $In_xGa_{1-x}N$ layer 110, the $In_yGa_{1-y}N$ well layer 112 ($0<y\leq0.35$) and the $In_zGa_{1-z}N$ barrier layer 114 ($0<z\leq0.2$) are grown by flowing TMGa, TMIn and TMAl sources on $N_2$ or $H_2+N_2$ carrier gas in $NH_3$ atmosphere. In this case, the low mole In-doped $In_xGa_{1-x}N$ layer 110 has a thickness of about 10 to 500 Å, and its surface is uniformly grown in a spiral mode. Further, at a surface growth temperature of about 700 to 800° C., the InGaN well layer 112 for emitting light is grown to a thickness of 5 to 30 Å and the InGaN barrier layer 114 is grown to a thickness of 50 to 500 Å.

In addition, in order to realize high brightness light emitting device performance, it is necessary to maintain the uniform spiral mode from the surface of the low mole In-doped $In_xGa_{1-x}N$ layer 110 to the InGaN barrier layer 114. If above growth conditions are satisfied, a practical high brightness light emitting device can be fabricated through the formation of an active layer having a single quantum well structure as well as having a multiple quantum well structure. Of course, the multiple quantum well structure can be adopted in cases that other parts are the same.

In the meantime, the content distribution of dopant in the low mole In-doped $In_xGa_{1-x}N$ layer 110, the $In_yGa_{1-y}N$ well layer 112 and the $In_zGa_{1-z}N$ barrier layer 114 can be adjusted as follows: The In content of the low mole In-doped $In_xGa_{1-x}N$ layer 110 is adjusted to be lower than that of the $In_zGa_{1-z}N$ barrier layer 114. The doped In contents x, y and z may be expressed as $0<x<0.05$, $0<y<0.3$, and $0<z<0.1$.

After the active layer for emitting light is grown according to the above-described process steps, temperature is elevated to grow the Mg-doped p-type GaN based single crystal layer 118 in $H_2$, $N_2$ and $H_2+N_2$ gases and under $NH_3$ atmosphere. The p-type GaN layer 118 is grown to a thickness of about 500 to 5000 Å at a growth temperature of about 900 to 1020° C.

Upon the growth of the p-type GaN layer 118, the second electrode contact layer 120 of an $In_xGa_{1-x}N/In_yGa_{1-y}N$ super lattice structure ($0<x\leqq0.2$, and $0<y\leqq0.2$) is grown on the p-type GaN layer 118. The $In_xGa_{1-x}N/In_yGa_{1-y}N$ super lattice structure imparts efficient current spreading to the second electrode contact layer 120. The electrode of the second electrode contact layer can be advantageously obtained from electrode metal the same as that of the first electrode contact layer 108.

According to the nitride based 3-5 group compound semiconductor light emitting device of this embodiment, the first electrode contact layer 108 is formed of an n-type electrode contact layer and the second electrode contact layer 120 is formed of a n-type electrode contact layer. Since high contact resistance is originated from the low Mg doping efficiency of a p-type GaN layer used as a second electrode contact layer in a conventional nitride based 3-5 group compound semiconductor light emitting device having first and second electrode contact layers in the form of n-type and p-type electrode contact layers, this embodiment can overcome the high contact resistance and remove a resultant current spreading layer.

Regarding the relation with the p-type GaN layer 118, it can be expressed that the first electrode contact layer 108, the p-type GaN layer 118 and the second electrode contact layer 120 have an n-p-n junction.

Here, the second electrode contact layer 120 alternate with each other at a thickness of 2 to 50 Å, and the second electrode contact layer 120 has the maximum thickness under 200 Å. Also, the growing step can be performed by feeding $N_2$, $N_2+H_2$ and $NH_3$ gases and TMGa and TMIn sources in a growth temperature range from 700 to 850° C. in order to grow a high brightness light emitting device having a heterostructure which is excellent in internal quantum efficiency and operating voltage characteristics.

SECOND EMBODIMENT

Figure 2:
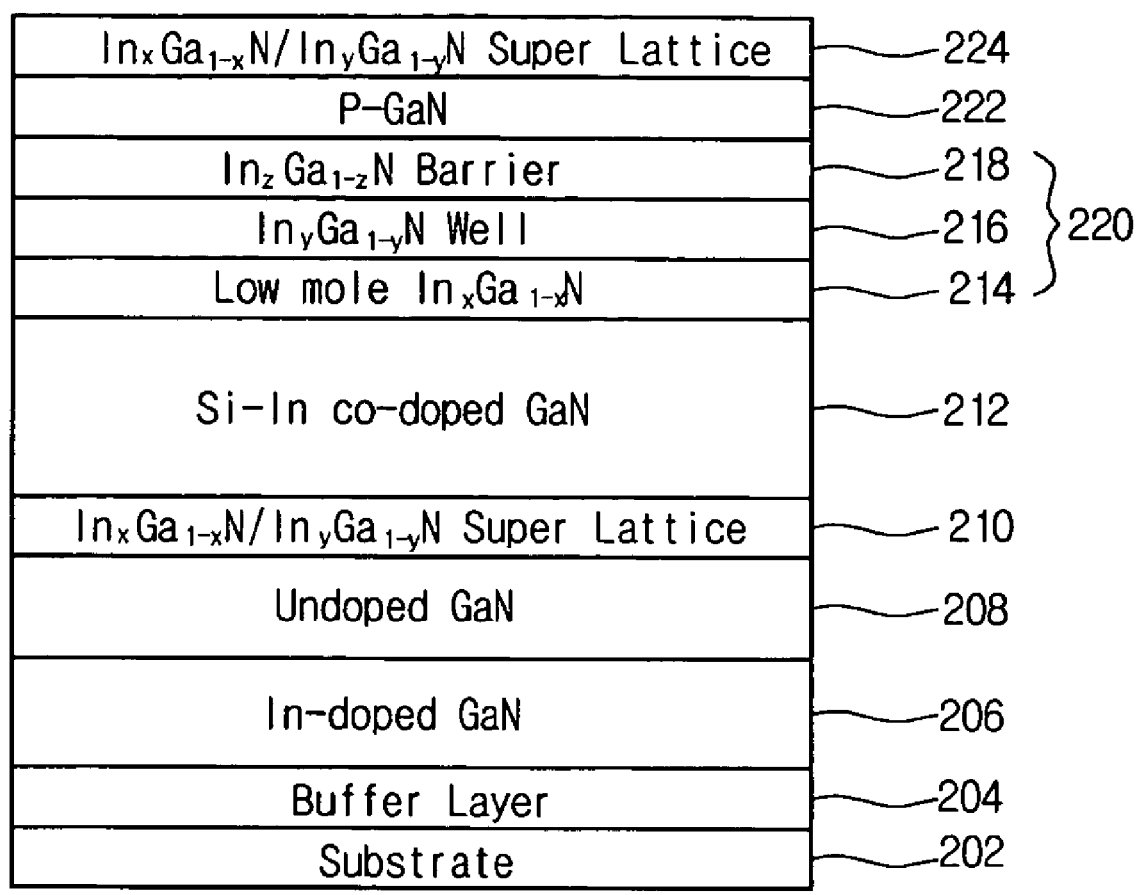
FIG. 2 illustrates a structure of a nitride based 3-5 group compound semiconductor light emitting device according to a second embodiment of the present invention.

FIG. 2 illustrates a structure of a nitride based 3-5 group compound semiconductor light emitting device according to a second embodiment of the present invention.

The structure of the nitride based 3-5 group compound semiconductor light emitting device of this embodiment shown in FIG. 2 is basically similar to that of the first embodiment except that an $In_xGa_{1-x}N/In_yGa_{1-y}N$ super lattice structure layer 210 is additionally placed underlying a first electrode contact layer 212 forming a heterostructure in order to minimize crystal defects originated from the mismatch of lattice constant and thermal expansion coefficient between a substrate 202 and a Si/In-doped GaN based single crystal layer 212.

This structure can reduce dislocation density propagated from the substrate 202 and a low temperature buffer layer 204 to improve the reverse breakdown voltage Vbr of the light emitting device thereby improving the reliability thereof.

The structure of the nitride based 3-5 group compound semiconductor light emitting device according to the second embodiment of the present invention will be described in brief as follows.

The buffer layer 204 is grown on the substrate 202, and a first electrode contact layer 212 is made of n-type GaN (codoped with Si and In) and a second electrode contact layer 224 is grown to have an $In_xGa_{1-x}N/In_yGa_{1-y}N$ super lattice structure. The first and second electrode contact layers 212 and 224 are provided with electrodes (not shown), respectively, in following process steps so that external voltage can be applied thereto via the electrodes.

The nitride based 3-5 group compound semiconductor light emitting device of the present invention also has an active layer 220 of a single quantum well structure which is interposed between the first electrode contact layer 212 and the second electrode contact layer 224 to form a heterostructure. The active layer 220 includes a low mole In-doped $In_xGa_{1-x}N$ layer 214, an $In_xGa_{1-y}N$ well layer 216 and an $In_xGa_{1-x}N$ barrier layer 218.

In addition, the nitride based 3-5 group compound semiconductor light emitting device also has an In-doped GaN layer 206 and an undoped GaN layer 208 between the buffer layer 204 and the first electrode contact layer 212. A p-type GaN layer 222 is also formed between the $In_xGa_{1-x}N$ barrier layer 218 and the second electrode contact layer 224.

A fabrication method of the nitride based 3-5 group compound semiconductor light emitting device having the above-described structure is similar to that of the first embodiment, and therefore will not be described further.

The second embodiment of this structure can reduce dislocation density propagated from the substrate 202 and the buffer layer 204 to improve the reverse breakdown voltage Vbr of the light emitting device and therefore to improve the reliability thereof.

THIRD EMBODIMENT

Figure 3:
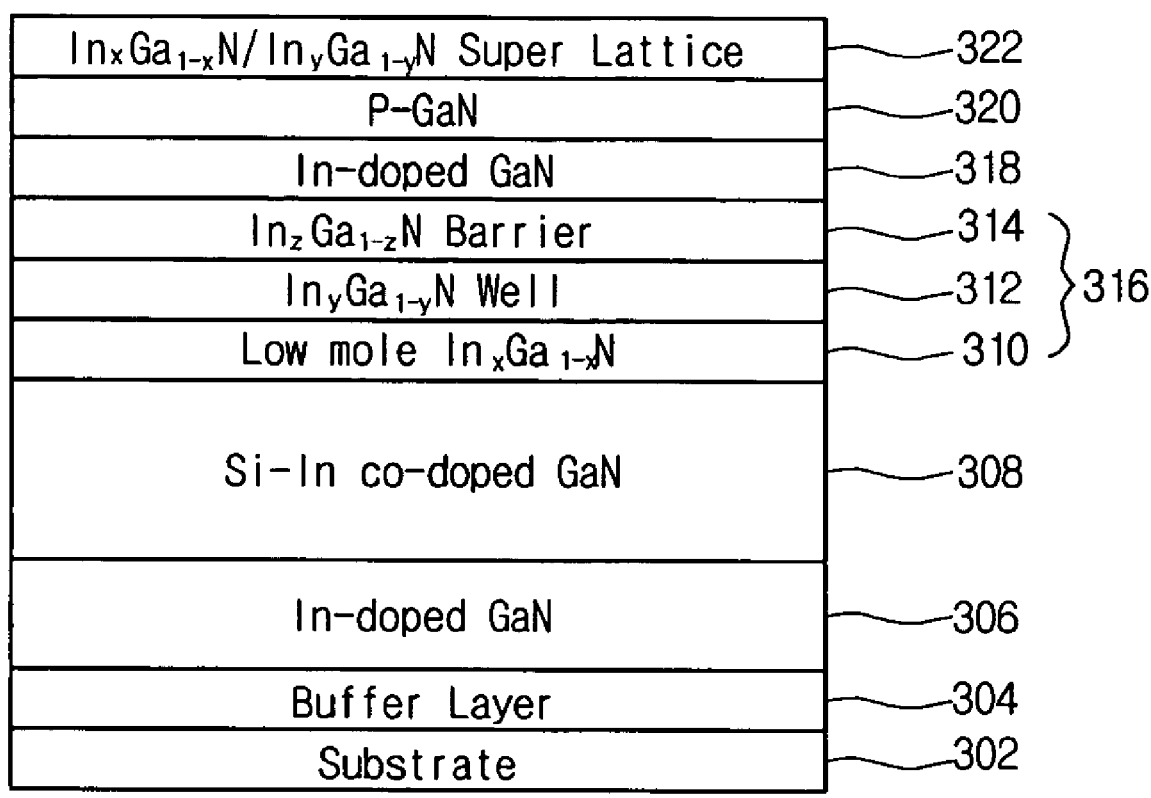
FIG. 3 illustrates a structure of a nitride based 3-5 group compound semiconductor light emitting device according to a third embodiment of the present invention.

FIG. 3 illustrates a structure of a nitride based 3-5 group compound semiconductor light emitting device according to a third embodiment of the present invention.

Referring to FIG. 3, this embodiment is generally similar to the first embodiment except that an In-doped GaN layer 318 is additionally interposed between a p-type GaN layer 320 and an $In_zGa_{1-z}N$ barrier layer 314 to form a heterostructure.

The additional In-doped GaN layer 318 can restrain the in-diffusion of Mg atoms used as dopant in the p-type GaN layer 320 thereby improving characteristics. The In-doped GaN layer 318 is grown to a thickness of 100 Å or less.

Hereinafter a fabrication method of the semiconductor light emitting device of the third embodiment will be described. A buffer layer 304 is grown on a substrate 302, a first electrode contact layer 308 is made of an n-type GaN (codoped with Si and In), and a second electrode contact layer 322 is formed of an $In_xGa_{1-x}N/In_yGa_{1-y}N$ super lattice structure. Herein, the first and second electrode contact layers 308 and 322 are provided with electrodes (not shown), respectively, in following process steps so that external voltage can be applied thereto via the electrodes.

The nitride based 3-5 group compound semiconductor light emitting device of the present invention also has an active layer 316 of a single quantum well structure which is interposed between the first electrode contact layer 308 and the second electrode contact layer 322 to form a heterostructure. The active layer 316 includes a low mole In-doped $In_xGa_{1-x}N$ layer 310, an $In_xGa_{1-y}N$ well layer 312 and an $In_xGa_{1-x}N$ barrier layer 314.

In addition, the nitride based 3-5 group compound semiconductor light emitting device also has an In-doped GaN layer 306 between the buffer layer 304 and the first electrode contact layer 308, and the p-type GaN layer 320 and the In-doped GaN layer 318 are placed between the $In_zGa_{1-z}N$ barrier layer 314 and the second electrode contact layer 322.

As described above, the additional GaN layer 318 of this embodiment can restrain the in-diffusion of Mg atoms used as dopant in the p-type GaN layer 320. This embodiment can improve characteristics of the light emitting device.

FOURTH EMBODIMENT

Figure 4:
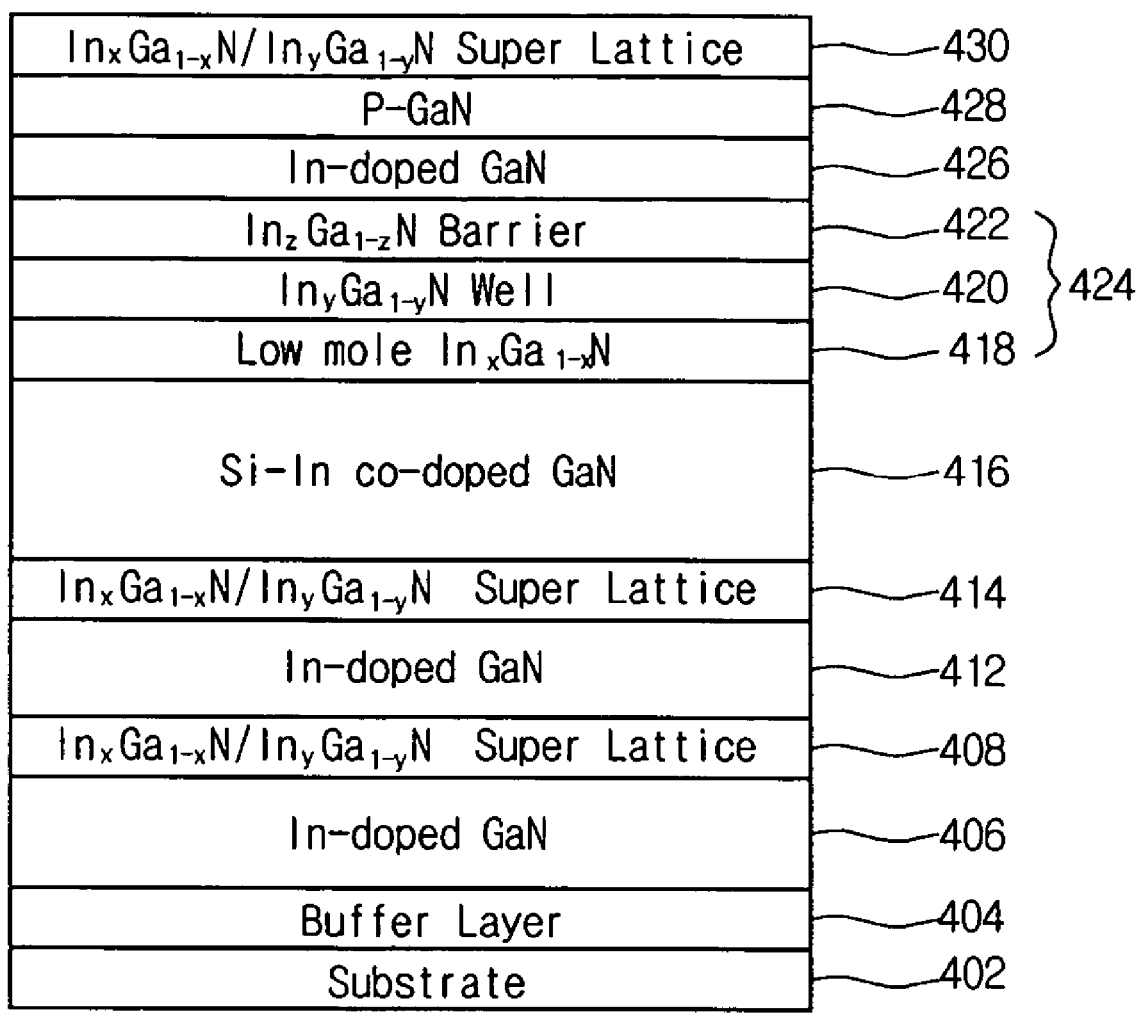
FIG. 4 illustrates a structure of a nitride based 3-5 group compound semiconductor light emitting device according to a fourth embodiment of the present invention.

FIG. 4 illustrates a structure of a nitride based 3-5 group compound semiconductor light emitting device according to a fourth embodiment of the present invention.

Many parts of the fourth embodiment are the same as those of the third embodiment except that an In-doped GaN layer 406, an $In_xGa_{1-x}N/In_yGa_{1-y}N$ super lattice structure layer 408, an In-doped GaN layer 412 and an $In_xGa_{1-x}N/In_yGa_{1-y}N$ super lattice structure layer 414 are additionally provided. The $In_xGa_{1-x}N/In_yGa_{1-y}N$ super lattice structure layer 408, the In-doped GaN layer 412 and the $In_xGa_{1-x}/In_yGa_{1-y}N$ super lattice structure layer 414 function to minimize crystal defects originated from the mismatch of lattice constant and thermal expansion coefficient from a substrate 402. Further, the $In_xGa_{1-x}N/In_yGa_{1-y}N$ super lattice structure layer 408 can reduce dislocation density propagated from the substrate 402 and a low temperature buffer layer 404 to improve the reverse breakdown voltage Vbr of the light emitting device.

Hereinafter a fabrication method of the semiconductor light emitting device of this embodiment will be described in detail with reference to FIG. 4.

The GaN-based semiconductor buffer layer 404 is grown on the sapphire substrate 402 at a low growth temperature. At the low growth temperature, the buffer layer 404 of the GaN-based semiconductor can be formed of an InGaN/GaN super lattice structure and a structure of $In_xGa_{1-x}N/GaN$ and $Al_x$-$In_yGa_{1-x,y}N/In_xGa_{1-x}N/GaN$.

The buffer layer 404 formed on the substrate 402 as above can efficiently restrict crystal defects induced from the mismatch of thermal expansion coefficient and lattice constant between the substrate 402 and a GaN based single crystal layer grown on the substrate 402, thereby producing a high quality GaN-based semiconductor.

Then, the In-doped GaN layer 406 is grown on the buffer layer 404 at a high growth temperature, and the $In_xGa_{1-x}N/In_yGa_{1-y}N$ super lattice structure layer 408 is additionally formed on the In-doped GaN layer 408 in order to minimize crystal defects originated from the mismatch of lattice constant and thermal expansion coefficient from the substrate 402.

This structure can reduce dislocation density propagated from the substrate 402 and the low temperature buffer layer 404 to improve the reverse breakdown voltage Vbr of the light emitting device thereby improving the reliability thereof.

Also, the In-doped GaN layer 412 and the $In_xGa_{1-x}N/In_yGa_{1-y}N$ super lattice structure layer 414 are additionally formed on the $In_xGa_{1-x}N/In_yGa_{1-y}N$ super lattice structure layer 408 in order to further reduce crystal defects.

Then, a Si/In-codoped GaN layer 416 is grown on the $In_xGa_{1-x}N/In_yGa_{1-y}N$ super lattice structure layer 414. The Si/In-codoped GaN layer 416 is used as a first electrode contact layer.

After that, a single quantum well layer is formed in an active layer 424 for emitting a desired wavelength range of light. More particularly, a low mode In-doped $In_xGa_{1-x}N$ layer 418 ($0<x\leq0.2$) is first grown in the active layer 424 in order to improve the internal quantum efficiency of the active layer 424. A quantum well structure including an $In_yGa_{1-y}N$ well layer 420 and an $In_zGa_{1-z}N$ barrier layer 422 of different In content are grown on the low mole In-doped $In_xGa_{1-x}N$ layer 418 to complete the active layer.

In the growing step, the active layer 424 of the single quantum well structure including the low mole In-doped $In_xGa_{1-x}N$ layer 418, the $In_yGa_{1-y}N$ well layer 420 ($0<y\leq0.35$) and the $In_zGa_{1-z}N$ barrier layer 422 ($0<z\leq0.2$) are grown by feeding $N_2$ and $H_2+N_2$ gases and TMGa, TMIn and TMAl sources under $NH_3$ atmosphere. The low mole $In_xGa_{1-x}N$ layer 418 has a thickness of about 10 to 500 Å, and its surface is uniformly grown in a spiral mode.

The InGaN well layer 420 for emitting light is grown to a thickness of 10 to 40 Å and the InGaN barrier layer 422 is grown to a thickness of 50 to 500 Å at a growth temperature of about 700 to 800° C. In addition, in order to realize high brightness light emitting device performance, it is necessary to maintain the uniform spiral mode from the surface of the low mole In-doped $In_xGa_{1-x}N$ layer 418 to the $In_zGa_{1-z}N$ barrier layer 422. If the above growth conditions are satisfied, a practical high brightness light emitting device can be fabricated through the formation of an active layer having a single quantum well structure as well as that having a multiple quantum well structure.

After the growth of the light-emitting active layer, the In-doped GaN layer 426 and a Mg-doped p-type GaN GaN based single crystal layer 428 are grown. The p-type GaN layer 428 is grown to a thickness of about 500 to 5000 Å at a growth temperature of about 900 to 1020° C.

Then, after the p-type GaN layer 428 is grown, a second electrode contact layer 430 of an $In_xGa_{1-x}N/In_yGa_{1-y}N$ super lattice structure ($0<y\leq0.2$, and $0<x\leq0.2$) is grown on the p-type GaN layer 428. Advantageously, the $In_xGa_{1-x}N/In_yGa_{1-y}N$ super lattice structure can effectuate the current spreading of the second electrode contact layer 430, The electrode of the second electrode contact layer can be advantageously obtained from electrode metal the same as that of the first electrode contact layer 416.

According to the nitride based 3-5 group compound semiconductor light emitting device of this embodiment, the first electrode contact layer 416 is formed of an n-type electrode contact layer and the second electrode contact layer 430 is formed of a n-type electrode contact layer. Since high contact resistance is originated from the low Mg doping efficiency of a p-type GaN layer used as a second electrode contact layer in a conventional nitride based 3-5 group compound semiconductor light emitting device having first and second electrode contact layers in the form of n-type and p-type electrode contact layers, this embodiment can overcome the high contact resistance and remove a resultant current spreading layer.

Regarding the relation with the p-type GaN layer 428, it can be expressed that the first electrode contact layer 416, the p-type GaN layer 428 and the second electrode contact layer 430 have an n-p-n junction. The super lattice structure layers of the second electrode contact layer 430 alternate with each other at a thickness of 2 to 50 Å, and the second electrode contact layer 430 has the maximum thickness under 200 Å. Also, the growing step can be performed by feeding $N_2$, $N_2+H_2$ and $NH_3$ gases and TMGa and TMIn sources in a growth temperature range from 700 to 850° C. in order to grow a high brightness light emitting device having a heterostructure excellent in internal quantum efficiency and operating voltage characteristics.

INDUSTRIAL APPLICABILITY

According to the nitride based 3-5 group compound semiconductor light emitting device and its fabrication method of the present invention as set forth above, it is possible to effectively restrain crystal defects originated from the mismatch of thermal expansion coefficient and lattice constant between a substrate of for example sapphire and a GaN GaN based single crystal layer grown thereon thereby to grow high quality GaN-based semiconductors. In particular, an $In_xGa_{1-x}N/In_yGa_{1-y}N$ super lattice structure is placed underlying a Si/In-codoped GaN layer used as a first electrode contact layer thereby to further restrain crystal defects.

Also, a low mole In-doped $In_xGa_{1-x}N$ is added in order to raise the internal quantum efficiency of an active layer thereby uniformly controlling the growth mode of a quantum well. Since the $In_xGa_{1-x}/In_yGa_{1-y}N$ super lattice structure is used as a second electrode contact layer, operating voltage can be reduced. As a consequence, the present invention can advantageously reduce crystal defects of a nitride based 3-5 group compound semiconductor light emitting device as well as improve the crystallinity of a GaN GaN based single crystal layer, thereby improving the performance and reliability of the nitride based 3-5 group compound semiconductor light emitting device.

The invention claimed is:

1. A fabrication method of a nitride based 3-5 group compound semiconductor light emitting device, comprising:
    forming a buffer layer above a substrate at a temperature of 500°-700° C.;
    forming a first In-doped GaN layer above the buffer layer;
    forming a first electrode contact layer above the first In-doped GaN layer;
    forming an active layer, comprising a single or multiple quantum well structure, including a low mole In-doped $In_xGa_{1-x}N$ layer, an $In_yGa_{1-y}N$ well layer, and an $In_zGa_{1-z}N$ barrier layer, and the low mole In-doped $In_xGa_{1-x}N$ layer has an In content smaller than that of the $In_zGa_{1-z}N$ barrier layer for emitting light above the first electrode contact layer;
    forming a GaN layer above the active layer at a temperature of 900°-1020° C.; and
    forming a second electrode contact layer, comprising an $In_xGa_{1-x}N/In_yGa_{1-y}N$ super lattice structure layer, above the GaN layer.

2. The fabrication method according to claim 1, wherein the first electrode contact layer comprises a Si/In-codoped GaN layer.

3. The fabrication method according to claim 1, wherein the low mole In-doped $In_xGa_{1-x}N$ layer is grown to have a surface configuration in a spiral mode.

4. The fabrication method according to claim 1, wherein the low mole In-doped $In_xGa_{1-x}N$ layer is grown into a surface configuration of a spiral mode, wherein the spiral mode is extended to the surface of the $In_zGa_{1-z}N$ barrier layer.

5. The fabrication method according to claim 1, wherein in the low mole Indoped $In_xGa_{1-x}N$ layer, the $In_yGa_{1-y}N$ well layer and the $In_zGa_{1-z}N$ bartier layer, $0<x\leq0.2$, $0<y\leq0.35$, and $0<z\leq0.2$.

6. The fabrication method according to claim 1, wherein the GaN layer above the active layer is formed to a thickness of about 500 to 5000 Å in $H_2$, $N_2$ and $H_2+N_2$ gases and under $NH_3$ atmosphere.

7. The fabrication method according to claim 1, wherein the second n-type electrode contact layer alternates with each other at a thickness of 2 to 50 Å, and has the maximum thickness under 200 Å.

8. The fabrication method according to claim 1, wherein the second n-type electrode contact layer is formed by feeding $N_2$, $N_2+H_2$ and $NH_3$ gases and TMGa and TMIn sources in a temperature range from 700 to 850° C., and the second n-type electrode contact layer has a hetero-structure.

9. A fabrication method of a nitride based 3-5 group compound semiconductor light emitting device, comprising:
    forming a buffer layer above a substrate at a temperature of 500° C.~700° C.;
    forming a first In-doped GaN layer above the buffer layer;
    forming a first electrode contact layer above the first In-doped GaN layer;
    forming an active layer, including a single or multiple quantum well structure, including a low mole In-doped $In_xGa_{1-x}N$ layer, an $In_yGa_{1-y}N$ well layer and an $In_zGa_{1-z}N$ barrier layer, for emitting light above the first electrode contact layer;
    forming a GaN layer above the active layer at a temperature of 900° C.~1020° C.; and
    forming a second electrode contact layer, comprising an $In_xGa_{1-x}N/In_yGa_{1-y}N$ super lattice structure layer, above the GaN layer.

10. The fabrication method according to claim 9, wherein the first electrode contact layer comprises a Si/In-codoped GaN layer.

11. The fabrication method according to claim 9, wherein the low mole In-doped $In_xGa_{1-x}N$ layer is grown to have a surface configuration in a spiral mode.

12. The fabrication method according to claim 9, wherein the low mole In-doped $In_xGa_{1-x}N$ layer is grown into a surface configuration of a spiral mode, wherein the spiral mode is extended to the surface of the $In_zGa_{1-z}N$ barrier layer.

13. The fabrication method according to claim 9, where $0<x\leq0.05$, $0<y\leq0.3$, and $0<z<0.1$.

14. The fabrication method according to claim 9, wherein the GaN layer above the active layer is formed to a thickness of about 500 to 5000 Å in $H_2$, $N_2$ and $H_2+N_2$ gases and under $NH_3$ atmosphere.

15. The fabrication method according to claim 9, wherein the second n-type electrode contact layer alternates with each other at a thickness of 2 to 50 Å, and has the maximum thickness under 200 Å.

16. The fabrication method according to claim 9, wherein the second n-type electrode contact layer is formed by feeding $N_2$, $N_2+H_2$ and $NH_3$ gases and TMGa and TMIn sources in a temperature range from 700 to 850° C., and the second n-type electrode contact layer has a hetero-structure.

* * * * *